(12) United States Patent
Scade et al.

(10) Patent No.: US 7,957,192 B2
(45) Date of Patent: Jun. 7, 2011

(54) READ AND VOLATILE NV STANDBY DISTURB

(75) Inventors: Andreas Scade, Dresden (DE); Stefan Guenther, Dresden (DE); Jeong-Mo Hwang, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 541 days.

(21) Appl. No.: 12/006,225

(22) Filed: Dec. 31, 2007

(65) Prior Publication Data

US 2009/0168517 A1 Jul. 2, 2009

(51) Int. Cl.
*G11C 11/34* (2006.01)
(52) U.S. Cl. .............................. 365/185.18; 365/185.17

(58) Field of Classification Search ............. 365/185.18, 365/185.17
See application file for complete search history.

(56) References Cited

U.S. PATENT DOCUMENTS

| | | | |
|---|---|---|---|
| 5,822,246 A * | 10/1998 | Taub et al. ................ | 365/185.18 |
| 7,244,976 B2 * | 7/2007 | Cai et al. ........................ | 257/208 |
| 2001/0055223 A1 * | 12/2001 | Iwahashi ................... | 365/185.17 |
| 2006/0104116 A1 * | 5/2006 | Yoon et al. ................ | 365/185.17 |
| 2007/0252192 A1 * | 11/2007 | Mokhlesi et al. ............. | 257/315 |
| 2008/0112227 A1 * | 5/2008 | Kim ......................... | 365/185.17 |

* cited by examiner

*Primary Examiner* — Vu A Le
*Assistant Examiner* — Han Yang

(57) ABSTRACT

A method of operating a nonvolatile memory circuit having a plurality of transistors arranged in series between a voltage/current source node and recall sink node includes asserting a gate bias on an isolation transistor between the source node and a charge storage transistor during nonvolatile STANDBY.

15 Claims, 4 Drawing Sheets

READ AND VOLATILE NV STANDBY DISTURB

TECHNICAL FIELD

The present disclosure relates to memory cell circuits.

BACKGROUND

SONOS (Silicon-oxide-nitride-oxide semiconductor) transistors are useful in memory circuits for providing nonvolatile storage. However, SONOS transistors have traditionally operated in bias environments that tend to reduce the effective product lifetime and/or operating temperature of the SONOS transistors.

Biasing a SONOS transistor with an effective positive voltage on its gate will increase its ERASE threshold voltage. Likewise, biasing a SONOS transistor with an effective negative voltage on its gate will decrease its STORE (i.e. PROGRAM) threshold voltage. Both effects reduce the threshold voltage operating window of the SONOS transistor.

During non-volatile READ/RECALL, a stored non-volatile bit may be read to a bit line and sensed. During this process, the gate of a SONOS transistor may be biased in ways that tend to reduce the effective life or operating temperature of the transistor.

Due to capacitive effects, the gates of a SONOS transistor may remain in a biased state after a non-volatile operation (such as ERASE, RECALL, and STORE) when the memory circuit enters a "STANDBY" mode. The lingering bias voltage may over time cause drift in the voltage threshold window of the transistor.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

"Logic" refers to signals and/or information that may be applied to influence the operation of a device. Software, hardware, and firmware are examples of logic. Hardware logic may be embodied in circuits. In general, logic may comprise combinations of software, hardware, and/or firmware.

Those skilled in the art will appreciate that logic may be distributed throughout one or more devices, and/or may be comprised of combinations of instructions in memory, processing capability, circuits, and so on. Therefore, in the interest of clarity and correctness logic may not always be distinctly illustrated in drawings of devices and systems, although it is inherently present therein.

Embodiments comprising SONOS transistors are described herein. It should be appreciated that other types of nonvolatile storage elements may be employed, such as silicon nitride oxide semiconductor (SNOS) transistors, floating gate transistors, ferroelectric transistors, and capacitors, to name a few.

Figure 1:
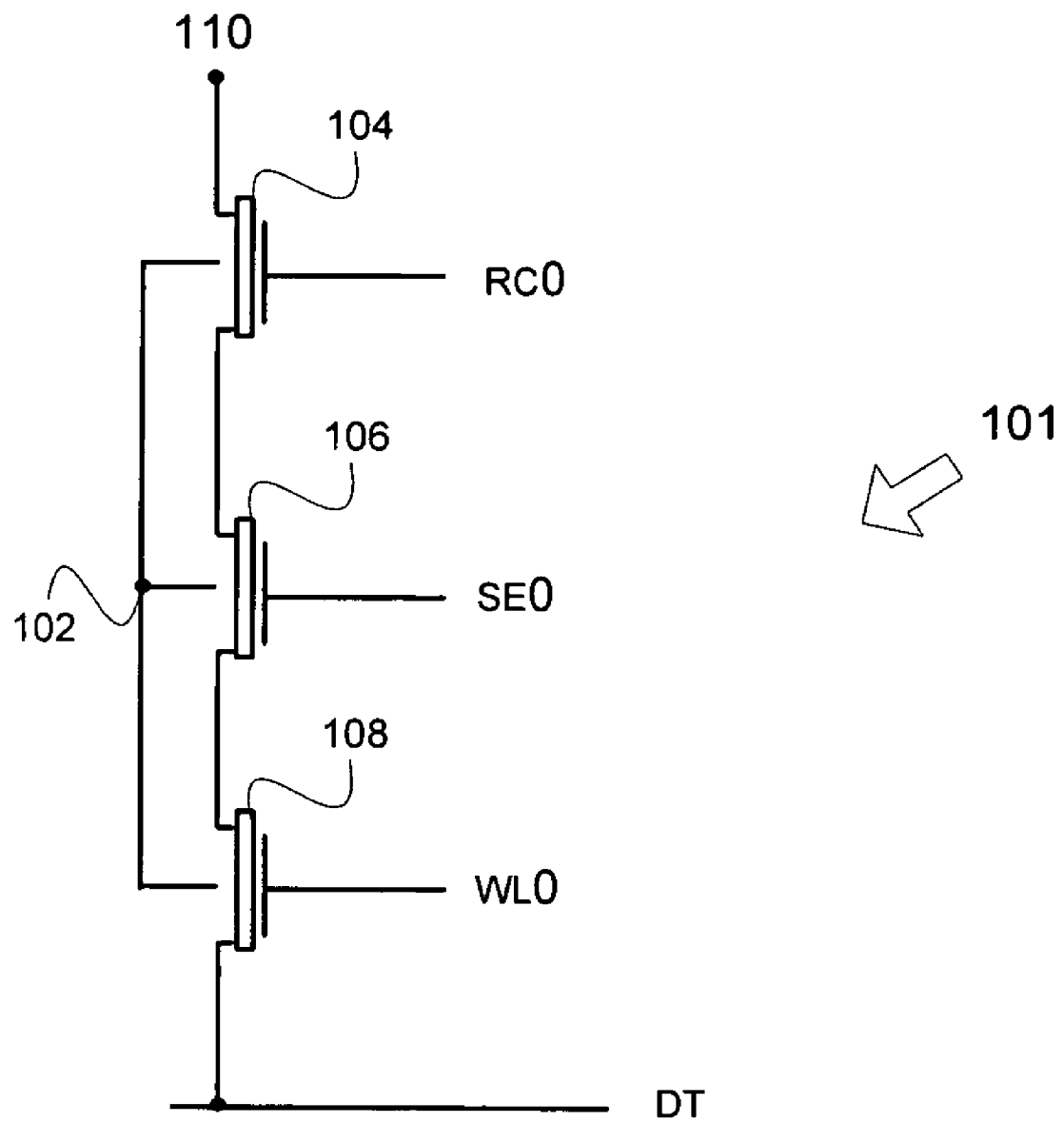
FIG. 1 is an illustration of a storage cell, commonly referred to as a 'trigate structure', of a conventional nonvolatile memory circuit.

FIG. 1 is an illustration of a storage cell, commonly referred to as a 'trigate structure', of a conventional nonvolatile memory circuit. Transistors 104 and 108 are isolation transistors, and can be conventional CMOS technology. Transistor 106 is typically a SONOS transistor.

DT is, in some embodiments, a node of a volatile memory cell coupled to the trigate structure. Node 110 provides a source of current for charging the node DT during RECALL of non-volatile information from the trigate structure. Herein, the node DT may be referred to as a "recall sink node", due to the fact that it may act as a sink of current (and being charged by said current) during nonvolatile RECALL. Node 110 may also, optionally, provide a source of voltage during STORE to balance voltages at the source and drain of transistor 106, thus reducing leakage current through 104 and lessening drift of the threshold window of 106 over time.

A full memory cell may include two such trigate structures. For example, the trigate circuit 101 may be employed along with a similar circuit in a complement bit storage arrangement. One circuit may store a nonvolatile bit, and its partner circuit may store a complement nonvolatile bit. This enables a differential bit sensing arrangement to be employed.

The circuit 101 may also be employed along with a corresponding one or pair of volatile memory storage circuits. This "hybrid" or "integrated" memory arrangement may be used to backup and restore data between nonvolatile and volatile memory. For example, in some embodiments, such as nvS-RAM, each trigate structure may have an associated volatile storage cell, for example in the form of a cross-coupled charge latch (not shown) implemented via n-type/p-type transistor pairs. Those skilled in the art will appreciate that there are various ways to utilize the trigate structure and the procedures associated therewith as described herein.

Figure 2:
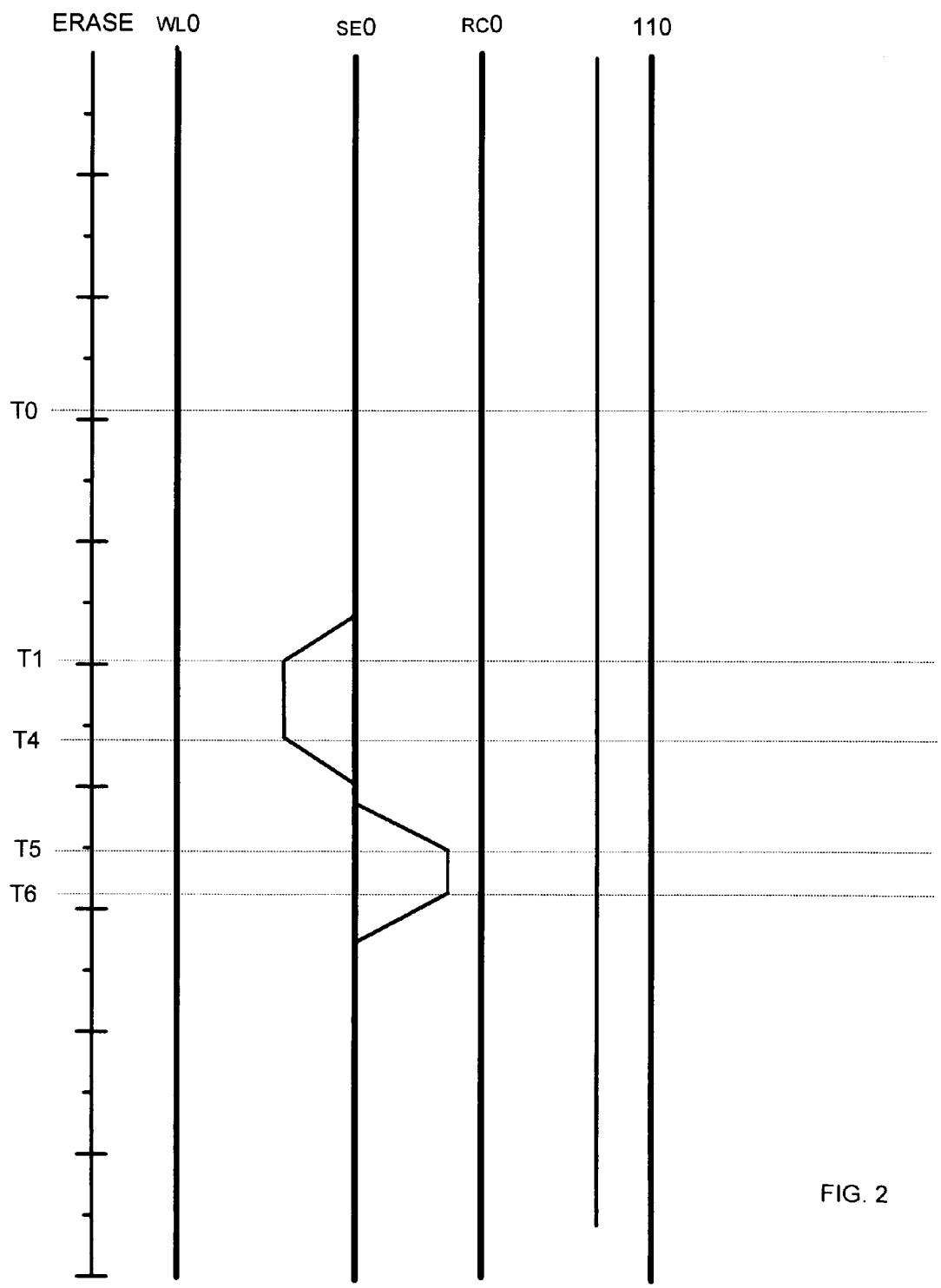
FIG. 2 is a timing diagram of an embodiment of an ERASE operation.
Figure 3:
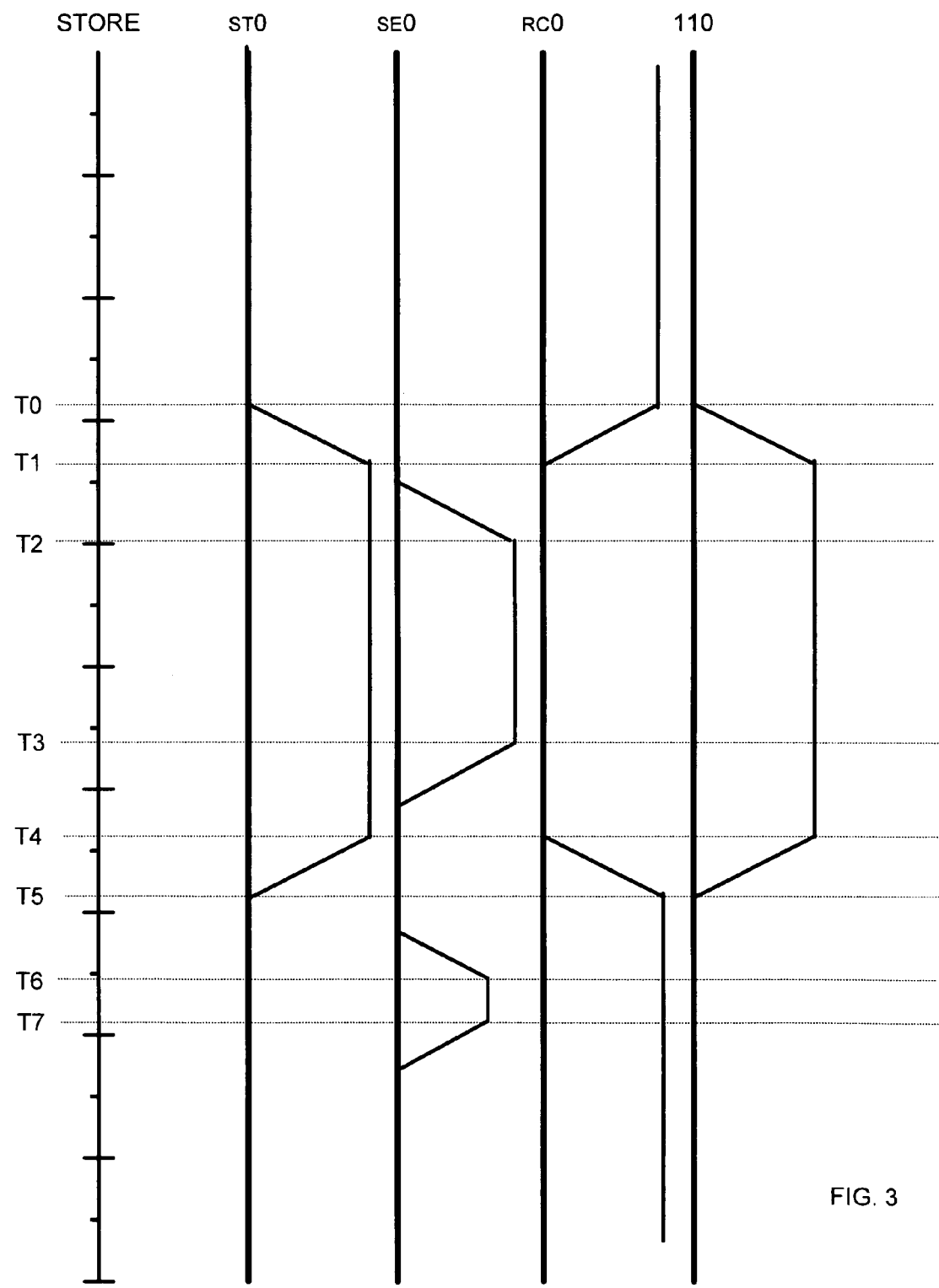
FIG. 3 is a timing diagram of an embodiment of a STORE operation.
Figure 4:
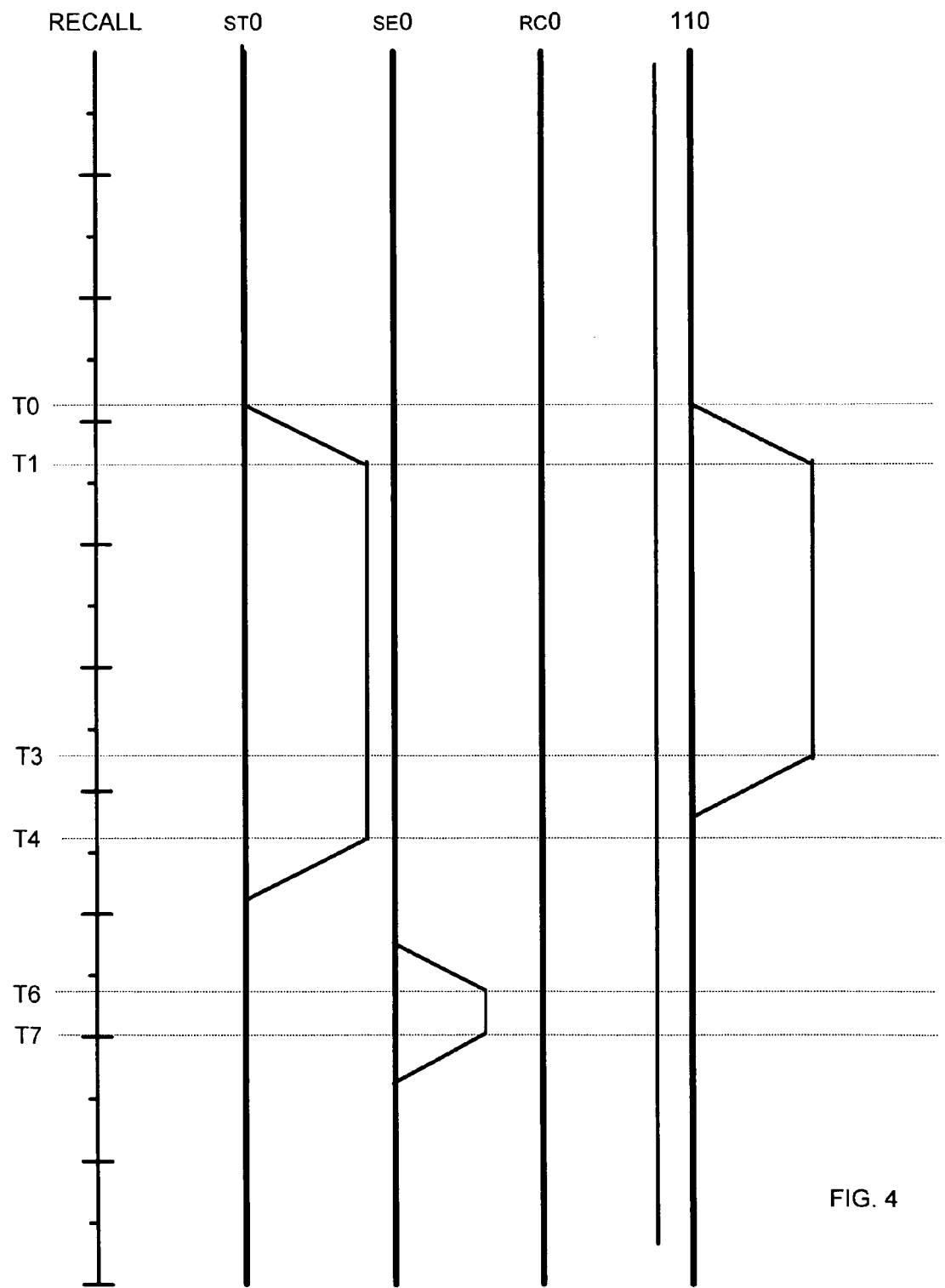
FIG. 4 is a timing diagram of an embodiment of RECALL signaling.

FIGS. 2-4 are timing diagrams of embodiments of nonvolatile operations. For STORE and RECALL, the Store Line (ST0) is asserted to couple DT to the charge storage transistor 106, which may be a SONOS transistor in some embodiments.

References to "high" voltage, "logical high", and "asserted" refer to setting a voltage to a value substantially corresponding to the value of a "one" bit. In many embodiments this will be the circuit supply voltage Vcc, or approximately 3 volts. References to "low" voltage, "logical low", and "unasserted" refer to setting a voltage to a value substantially corresponding to the value of a "zero" bit. In many embodiments this will be the circuit supply voltage Vss, ground, or zero volts.

FIG. 2 is a timing diagram of an embodiment of an ERASE operation. A high (higher than logical high) negative voltage −Vprog may be applied to the gate of transistor 106 in order to effect the ERASE. For example, −Vprog may be −10V for SONOS transistors. The illustrated ERASE differs from conventional ERASE operations in that the voltage at 110 may be maintained low during nv-standby before and after ERASE, and also during ERASE. RC0 is maintained high during nv-standby and during ERASE. Also, a pulse is applied to SE0 (gate of transistor 106) after the ERASE in order to help neutralize any effective gate voltage remaining on transistor 106 after ERASE due, for example, to source-drain capacitance of 106.

FIG. 3 is a timing diagram of an embodiment of a STORE operation. A high (higher than logical high) positive voltage Vprog may be applied to the gate of transistor 106 in order to effect the STORE. For example, Vprog may be 10V for SONOS transistors. The illustrated STORE differs from conventional STORE operations in that the voltage at 110 may be maintained low during standby before and after STORE, and optionally may be raised high during STORE to reduce the effective voltage at the gate of transistor 106 during STORE (e.g. from source-drain capacitance of 106). This may reduce leakage effects and also reduce the rate of drift in the threshold voltage of 106 over time.

RC0 is maintained high during standby and dropped low during STORE. Also, a pulse is applied to SE0 (T6-T7) after the STORE in order to help neutralize any effective gate voltage remaining on transistor 106 after STORE.

STORE operations may charge source and drain of 106 to a high voltage level that is greater even than logical high (e.g. Vcc). The source-to-drain voltage of 106 in these prior approaches is charged or discharged after nonvolatile operations by leakage currents, which may take time and hence expose the gate of 106 to an effective bias voltage that adversely impacts the threshold window over time.

FIG. 4 is a timing diagram of an embodiment of RECALL signaling. The signaling depicted in FIG. 4 may speed the RECALL process over conventional approaches, and hence may extend the useful life of the memory circuit by reducing the rate of threshold window drift.

During RECALL SE0=low (0V), however the source and/or drain voltages of transistor 106 may be high (e.g. Vcc, logical high), creating an effective negative gate voltage (e.g. −Vcc) at the gate of transistor 106. This negative voltage at the gate of 106 will act over time to decrease the program threshold voltage of transistor 106 (threshold voltage that must be applied to the gate of 106 to effect a STORE).

In conventional RECALL operations, the voltage at 110 is normally sustained at logical high during STANDBY. RC0 and ST0 are sustained at logical low during STANDBY, and the rise of RC0 and ST0 to logical high during RECALL is carefully synchronized.

In the approach of FIG. 4, RC0 is sustained at logical high (even during standby). There is thus no need to synchronize the rise of RC0 with the rise of ST0. The amount of time that 110 is made high can be carefully controlled, limiting the time during which the gate of transistor 106 is subjected to effective negative voltage during RECALL.

Also, a pulse is applied to SE0 (at the gate of transistor 106) after the RECALL in order to help neutralize any effective gate voltage remaining on transistor 106 after RECALL.

Conventionally, transistors are adapted specifically to have low and indeed minimal sub-threshold voltage leakage currents. In another embodiment, instead of or in addition to applying the post-operation pulse, the transistor 106 may be adapted to have a substantial sub threshold leakage current. This will lessen or eliminate charging of the source of 106 via parasitic effects during STORE and other nonvolatile operations.

Those having skill in the art will appreciate that there are various vehicles by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A method of operating a nonvolatile memory circuit, the method comprising:
    asserting a positive gate bias on an isolation transistor between a voltage-current source node and a nonvolatile bit charge storage transistor during nonvolatile STANDBY.

2. The method of claim 1, further comprising:
    asserting the gate bias on the isolation transistor during one or more of ERASE, STORE, and RECALL operations.

3. The method of claim 1, further comprising:
    maintaining the voltage-current source node unasserted during STANDBY, asserting the source node at or near the beginning of a RECALL operation, and unasserting the voltage-current source node at or near a time when the nonvolatile bit is sensed.

4. The method of claim 1, wherein the memory circuit comprises:
    the charge storage transistor is a SONOS transistor.

5. The method of claim 1, wherein the memory circuit comprises: the isolation transistor arranged between the voltage-current source node and the charge storage transistor; and
    a second isolation transistor arranged between the charge storage transistor and the recall sink node.

6. A memory circuit comprising:
    at least one charge storage transistor for storage of a charge representing a nonvolatile memory bit; and
    electrical circuitry comprising logic to assert a positive gate bias on an isolation transistor between the voltage-current source node and the charge storage transistor during nonvolatile STANDBY.

7. The memory circuit of claim 6, further comprising:
    electrical circuitry comprising logic to assert the gate bias on the isolation transistor during one or more of ERASE, STORE, and RECALL operations.

8. The memory circuit of claim 6, further comprising:
    electrical circuitry comprising logic to maintain the voltage-current source node unasserted during STANDBY, assert the source node at or near the beginning of a RECALL operation, and unassert the voltage-current source node at or near a time when the nonvolatile bit is sensed.

9. The memory circuit of claim 6, further comprising:
    the charge storage transistor is a SONOS transistor.

10. The memory circuit of claim 6, further comprising:
    the isolation transistor arranged between the voltage-current source node and the charge storage transistor; and
    a second isolation transistor arranged between the charge storage transistor and the recall sink node.

11. A memory circuit comprising:
    at least one nonvolatile charge storage transistor for storage of a charge representing a nonvolatile memory bit;
    at least one volatile storage cell associated with the nonvolatile charge storage transistor, and
    electrical circuitry comprising logic to assert a positive gate bias on an isolation transistor between the voltage-current source node and the nonvolatile charge storage transistor during nonvolatile STANDBY.

12. The memory circuit of claim 11, further comprising:
    electrical circuitry comprising logic to assert the gate bias on the isolation transistor during one or more of ERASE, STORE, and RECALL operations.

13. The memory circuit of claim 11, further comprising:
    electrical circuitry comprising logic to maintain the voltage-current source node unasserted during STANDBY, assert the source node at or near the beginning of a RECALL operation, and unassert the voltage-current source node at or near a time when the nonvolatile bit is sensed.

14. The memory circuit of claim 11, further comprising:
    the nonvolatile charge storage transistor is a SONOS transistor.

15. The memory circuit of claim 11, further comprising:
    the isolation transistor arranged between the voltage-current source node and the nonvolatile charge storage transistor, and
    a second isolation transistor arranged between the nonvolatile charge storage transistor and the recall sink node.

* * * * *